United States Patent [19]

Ueda et al.

[11] Patent Number: 5,367,263

[45] Date of Patent: Nov. 22, 1994

[54] SEMICONDUCTOR INTEGRATED CIRCUIT DEVICE AND TEST METHOD THEREFOR

[75] Inventors: Kiyotoshi Ueda; Kazuhiro Nishimura, both of Itami, Japan

[73] Assignee: Mitsubishi Denki Kabushiki Kaisha, Tokyo, Japan

[21] Appl. No.: 997,920

[22] Filed: Dec. 29, 1992

[30] Foreign Application Priority Data

Jan. 23, 1992 [JP] Japan .................. 4-009860

[51] Int. Cl.$^5$ .................................. G01R 31/28
[52] U.S. Cl. ......................... 324/537; 324/158.1
[58] Field of Search ............... 324/158 R, 537, 719, 324/73.1; 371/22.1, 22.5, 22.6

[56] References Cited

U.S. PATENT DOCUMENTS

| | | | |
|---|---|---|---|
| 4,038,648 | 7/1977 | Chesley | 324/73.1 |
| 4,479,088 | 10/1984 | Stopper | 324/537 |
| 4,956,602 | 9/1990 | Parrish | 324/158 R |
| 4,961,053 | 10/1990 | Krug | 324/158 R |
| 5,059,899 | 10/1991 | Farnworth et al. | 324/158 R |

*Primary Examiner*—Ernest F. Karlsen
*Attorney, Agent, or Firm*—Oblon, Spivak, McClelland, Maier & Neustadt

[57] ABSTRACT

A semiconductor integrated circuit device includes individual circuit blocks which are tested according to the method of the invention. Circuit blocks of a semiconductor integrated circuit device may be tested independently of one another until all circuit blocks have been tested, or alternatively may be simultaneously tested. The multi-test method of the invention simultaneously tests plural semiconductor integrated circuit devices by successively testing corresponding circuit blocks on each semiconductor integrated circuit device. The test apparatus of the present invention is of minimal size and complexity, and greatly enhances testability of a semiconductor integrated circuit device.

3 Claims, 4 Drawing Sheets

SEMICONDUCTOR INTEGRATED CIRCUIT DEVICE AND TEST METHOD THEREFOR

BACKGROUND OF THE INVENTION

1. Field of the Invention

The present invention relates to a semiconductor integrated circuit device which is designed considering testability. The present invention also relates to a test method for testing such a semiconductor integrated circuit device.

2. Description of the Background Art

FIG. 1 is a plan view showing the structure of a conventional semiconductor integrated circuit device which is designed while taking testability into account. As shown in FIG. 1, a semiconductor integrated circuit 2 is formed on a semiconductor substrate 1. The semiconductor integrated circuit 2 comprises in its peripheral edge portion electrode pads 4 anti test electrode pads 5, the electrode pads 4 being external terminals for regular use and the test electrode pads 5 being external terminals only for test use. Surrounded by the electrode pads 4 and 5 is an electrical circuit part 3. The electrical circuit part 3 includes, in addition to regular circuit parts, a test circuit part for executing a testability-considered test such as the adhock method and the scan path method. The test electrode pads 5 are electrically connected to input/output parts of the test circuit part.

Operation of the electrical circuit part 3 of the semiconductor integrated circuit 2 is tested in the following manner. First, the electrode pads 4 and the test electrodes pads 5 are supplied with a predetermined test signal. Next, it is judged whether output signals from the electrode pads 4 and the test electrodes pads 5 each have an expected value.

Since the semiconductor integrated circuit 2 comprises the test electrode pads 5 and the test circuit part which is incorporated in the electrical circuit part 3, the test is superior regarding rationality and reduction in required time for a test of a semiconductor integrated circuit device which does not employ the test electrode pads 5 and the test circuit.

Thus, in general, the conventional testability-considered device as above includes the test circuit part which is designed for testability and the test electrode pads which are electrically connected to the test circuit part.

Among testability-considered test methods in light of which the test circuit part is designed are the adhock method and the scan path method. While proposed as a testability-considered test method, these methods require in order to ensure good testability a test circuit part that is complex in structure, and hence, difficult to design.

If improvement in testability is desired aiming at test time reduction, the test circuit part needs to be large, which in turn requires a greater number of the test electrode pads 5. This invites increase in the circuit area of the semiconductor integrated circuit 2, thereby increasing up the net manufacturing cost.

A semiconductor integrated circuit device enhanced in testability further requires a larger and more expensive test apparatus for testing the same.

SUMMARY OF THE INVENTION

A semiconductor integrated circuit device of an aspect of the present invention includes a first to an n-th circuit blocks where $n \geq 2$. The device comprises: a first to an n-th electrodes for transmission of an external signal, the first to the n-th electrodes for transmission of the external signal being connected to external signal input/output parts of the first to the n-th circuit blocks, respectively; internal wiring lines provided for transmission of an internal signal between the first to the n-th circuit blocks; a first to an n-th switching means mounted between internal signal input/output parts of the first to the n-th circuit blocks and the internal wiring lines, the first to the n-th switching means turning on and off under the control of a control signal which is given thereto from outside; and a first to an n-th electrodes for transmission of an internal signal, the first to the n-th electrodes for transmission of the internal signal being connected to the internal signal input/output parts of the first to the n-th circuit blocks, respectively.

The first to the n-th switching means may include a first to an n-th transistors, respectively, the first to the n-th transistors including: one side electrodes connected to the internal signal input/output parts of the first to the n-th circuit blocks; other side electrodes connected to the internal wiring lines; and control electrodes for receiving the control signal is received.

The semiconductor integrated circuit device may further comprises: a control signal electrode for receiving the control signal directly; and a control signal line, one end of the control line being connected to the control signal electrode, another end of the control signal line being connected commonly to the control electrodes of the first to the n-th transistors.

Alternatively, the semiconductor integrated circuit device may further comprises: a first to an n-th control signal electrodes, the first to the n-th control signal electrodes receiving a first to an n-th control signals, respectively; and a first to an n-lh control signal lines, one ends of the first to the n-th control signal lines being connected said first to the n-th control signal electrodes, another ends of the first to the n-th control signal lines being connected to the control electrodes of the first to the n-th transistors.

The present invention also relates to a test method for testing a semiconductor integrated circuit device which includes first to an n-th circuit blocks where $n \geq 2$, and which comprises: first to an n-th electrodes for transmission of an external signal, the first to the n-th electrodes for transmission of the external signal being connected to external signal input/output parts of the first to the n-th circuit blocks, respectively; internal wiring lines provided for transmission of an internal signal between the first to the n-th circuit blocks; a first to an n-th switching means mounted between internal signal input/output parts of the first to the n-th circuit blocks and the internal wiring lines, the first to the n-th switching means turning on and off under the control of a control signal which is given thereto from outside; and a first to an n-th electrodes for transmission of an internal signal, the first to the n-th electrodes for transmission of the internal signal being connected to the internal signal input/output parts of the first to the n-th circuit blocks, respectively. The test method comprising the steps of: turning off the k-th switching means of the first to the n-th switching means under the control of a control signal where $1 \leq k \leq n$; and giving a predetermined test signal to a signal input electrode of the electrode for transmission of the internal signal and a signal input electrode the electrode for transmission of the external signal of the k-th circuit block and obtaining an output signal at a signal output electrode of the electrode for transmission of the internal signal and a signal output electrode of the electrode for transmission of the external signal of the k-th circuit block.

A test method of a second aspect for testing such a semiconductor device comprises the steps of: turning off the k-th switching means and the l-th switching means of the first to the n-th switching means under the control of a control signal where $1 \leq k \leq n$, $l \neq k$ and $1 \leq l \leq n$; and giving predetermined test signal to a signal input electrode of the electrode for transmission of the internal signal and a signal input electrode of the electrode for transmission of the external signal of the k-th circuit block and obtaining an output signal at a signal output electrode of the electrode for transmission of the internal signal and signal output electrode of the electrode for transmission of the external signal of the k-th circuit block while giving a predetermined test signal to a signal input electrode of the electrode for transmission of the internal signal and a signal input electrode of the electrode for transmission of the external signal of the l-th circuit block and obtaining an output signal at a signal output electrode of the electrode for transmission of the internal signal and a signal output electrode of the electrode for transmission of the external signal of the l-th circuit block.

A test method of a third aspect is a method for simultaneously testing first to an n-th semiconductor integrated circuit devices. The first to the n-th semiconductor integrated circuit devices each include a first to an n-th circuit blocks where $n \geq 2$. Each of the first to the n-th semiconductor integrated circuit devices comprises: a first to an n-th electrodes for transmission of an external signal, the first to the n-th electrodes for transmission of the external signal being connected to external signal input/output parts of the first to the n-th circuit blocks, respectively; internal wiring lines provided for transmission of an internal signal between the first to the n-th circuit blocks; a first to an n-th switching means mounted between internal signal input/output parts of the first to the n-th circuit blocks and the internal wiring lines, the first to the n-th switching means turning on and off uander the control of a control signal which is given thereto from outside; and a first to an n-th electrodes for transmission of an internal signal, the first to the n-th electrodes for transmission of the internal signal being connected to the internal signal input/output parts of the first to the n-th circuit blocks, respectively. The test method comprising the steps of: turning off the i-th switching means of the first to the n-th switching means of the i-th semiconductor integrated circuit device where $1 \leq i \leq n$; and giving predetermined test signal to a signal input electrode of the electrode for transmission of the internal signal and a signal input electrode of the electrode for transmission of the external signal of the i-th circuit block and obtaining n output signal at a signal output electrode of the electrode for transmission of the internal signal and a signal output electrode of the electrode for transmission of the external signal of the i-th circuit block of the i-th semiconductor integrated circuit device.

Thus, since the first to the n-th switching means which are turned on and off in response to a control signal from outside are provided between the internal wiring lines and the internal signal input/output parts of the first to the n-th circuit blocks, it is possible to bring the k-th circuit block into an electrically independent state by turning off the k-th switching means where $1 \leq k \leq n$. Hence, a discrete test of the k-th circuit block is possible.

As a result, the semiconductor integrated circuit device of the present invention is relatively easily tested since a test result thereof is analyzed by test results of discrete tests of the circuit blocks.

A test apparatus is simplified in structure since the test apparatus separately tests the circuit blocks. An approach to ensure excellent testability is to only divide an electrical circuit part into the circuit blocks, and hence, relatively easy. The device integration is not degraded since it is not necessary to employ a circuit designed for testability.

Further, since the circuit blocks are separately tested, test time is reduced by testing all the circuit blocks at the same time.

In the third aspect of the method, an advantage of the present invention is also appreciated in that the test apparatuses remain simple in structure.

Accordingly, an object of the present invention is to obtain a semiconductor integrated circuit device which does not need a large test apparatus and which is easily enhanced in testability. In the semiconductor integrated circuit device, deterioration in the device integration due to enhanced testability does not result.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
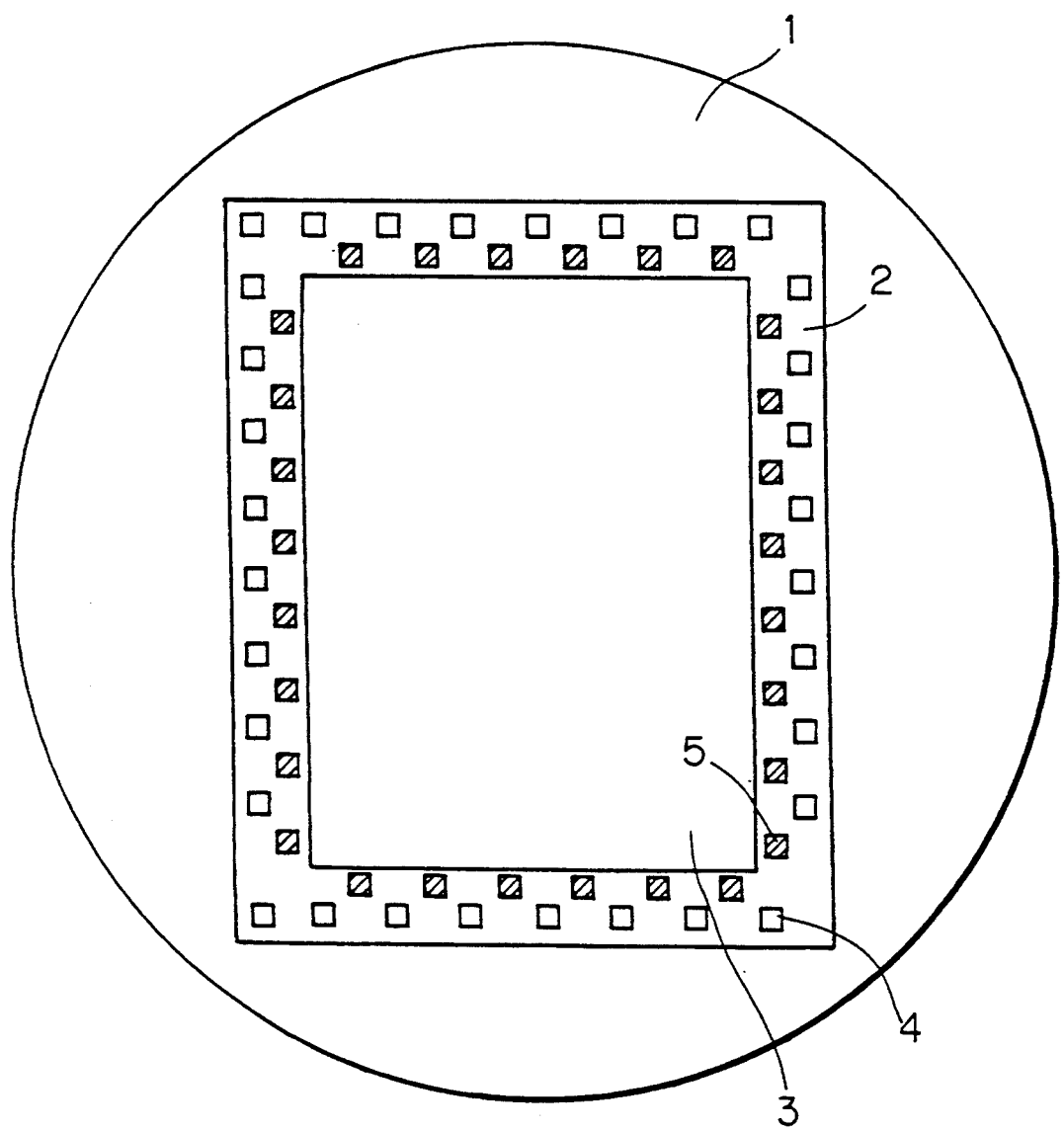
FIG. 1 is a plan view showing the structure of a conventional semiconductor integrated circuit device which is designed considering testability.
Figure 2:
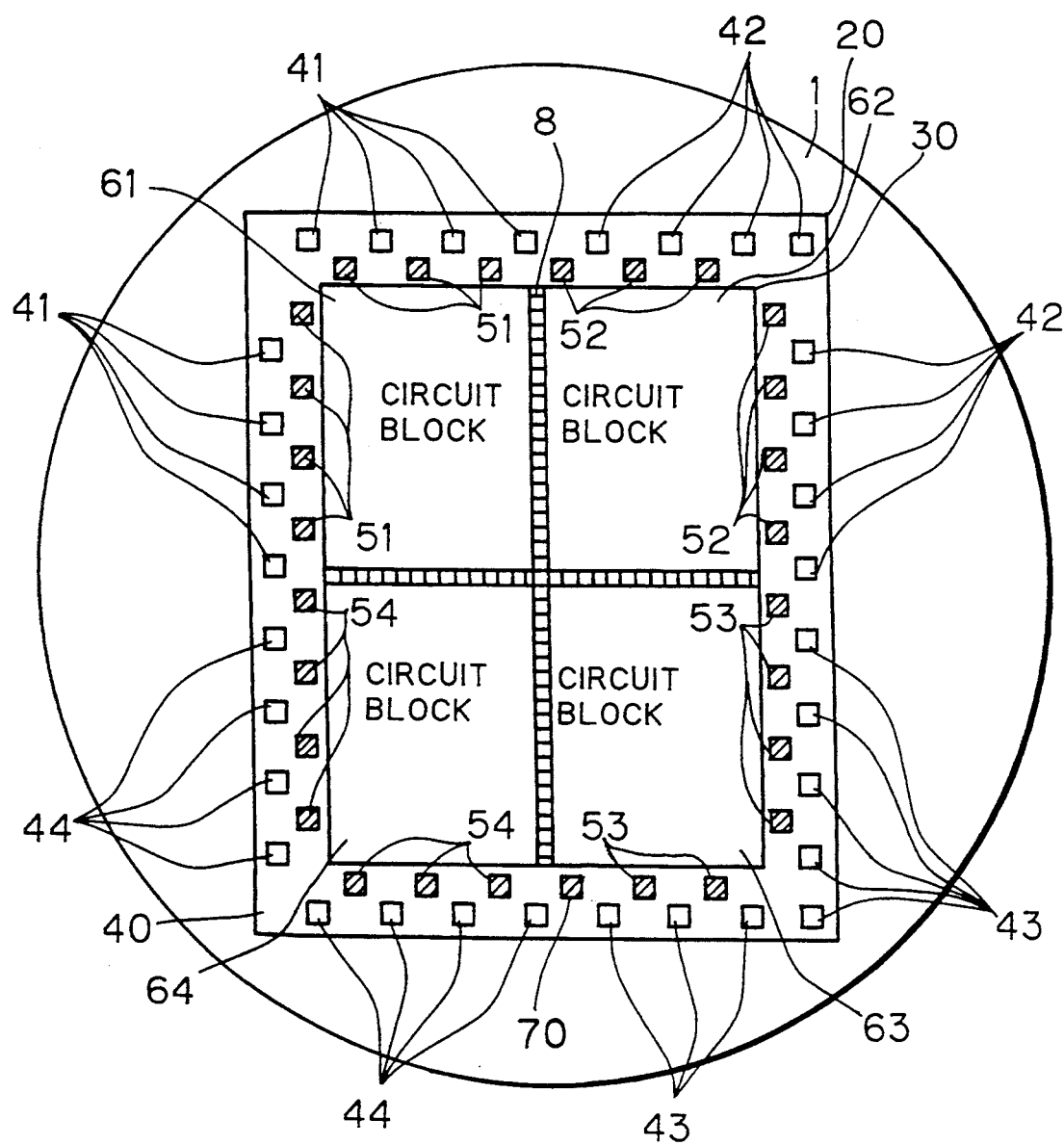
FIG. 2 is a plan view showing the structure of a semiconductor integrated circuit device according to a preferred embodiment of the present invention.

FIG. 2 is a plan view showing the structure of a semiconductor integrated circuit device according to a preferred embodiment of the present invention. As shown in FIG. 2, a semiconductor integrated circuit 20 is formed on a semiconductor substrate 1. The semiconductor integrated circuit 20 includes in its peripheral edge portion an electrode pad part 40. An electrical circuit part 30 is surrounded all the four sides by the electrode pad part 40.

The electrical circuit part 30 is divided into equal four parts, namely, circuit blocks 61, 62, 63 and 64. Signal transmission between the circuit blocks 61 to 64 is done through switch regions 8. The electrode pad part 40 includes electrode pads 41 to 44 and test electrode pads 51 to 54, the electrode pads 41 to 44 being external terminals for regular use and the test electrode pads 51 to 54 being an external terminals only for test use. A control electrode pad 70 for transmission of a control signal is also provided in the electrode pad part 40 (described later). The electrode pads 41 to 44 and the test electrode pads 51 to 54 are connected to an external signal input/output part and an internal signal input/output part, respectively, of the corresponding one of the circuit blocks 61 to 64.

Figure 3:
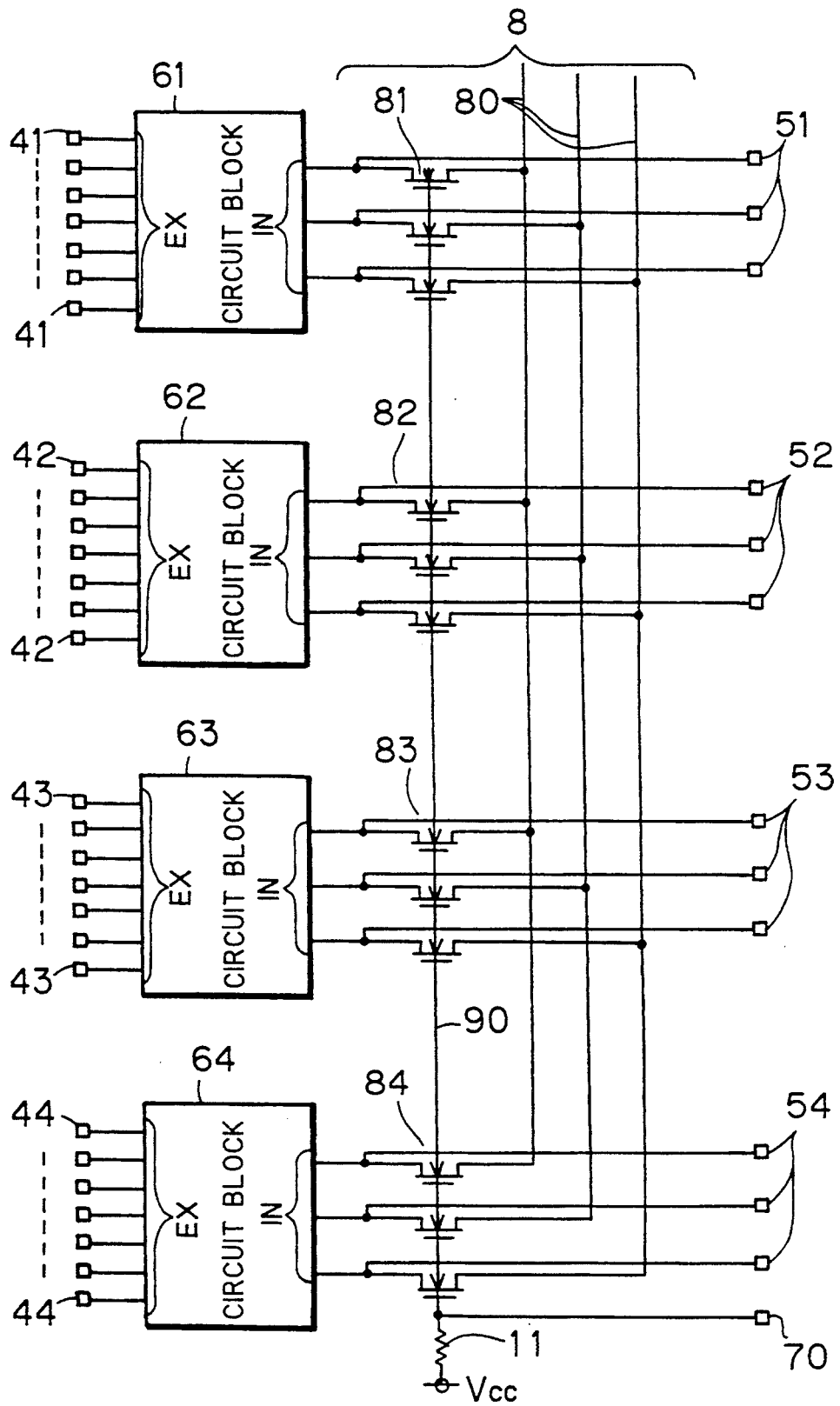
FIG. 3 is a circuitry diagram showing electrical connection within the semiconductor integrated circuit device of FIG. 2.

FIG. 3 is a circuitry diagram showing electrical connection between the circuit blocks 61 to 64. In the circuit block 61, an external signal EX is to be supplied to the electrode pads 41 while an internal signal IN is to be transmitted to internal wiring lines 80 through a normally-off NMOS transistor 81. The internal signal IN is also connected to the test electrode pads 51 (FIG. 3). Likewise, in the circuit block 62, the external signal EX is connected to the electrode pads 41 while the internal signal IN is to be supplied to the internal wiring lines 80 through a normally-off NMOS transistor 82 and also to the test electrode pads 52. In the circuit block 63, the external signal EX is connected to the electrode pads 43 while electrical connection between the internal signal IN and the internal wiring lines 80 is ensured through a normally-off NMOS transistor 83. The internal signal IN is to be given to the test electrode pads 53, too. In the circuit block 64, the external signal EX is connected to the electrode pads 44 while the internal signal IN is connected to the internal wiring lines 80 through a normally-off NMOS transistor 84. Electrical connection between the internal signal IN and the test electrode pads 54 is also ensured. The internal wiring lines 80 and the normally-off NMOS transistors 81 to 84 are formed in the switch regions 8 (FIG. 2).

The gates of the normally-off NMOS transistors 81 to 84 are connected commonly to the control electrode pad 70 through a control signal line 90. The gates are also connected to a power source $V_{cc}$ through a pull down resistor 11.

Whether the electrical circuit part 30 provided within the semiconductor integrated circuit 20 which is formed on the semiconductor substrate 1 operates normally is tested in the following manner.

First, a low level control signal is supplied to the control electrode pad 70 so that NMOS transistors 81 to 84 are turned off, thereby inhibiting transmission of the internal signal IN between the circuit blocks 61 to 64 via the internal wiring lines 80. This is the same as bringing the circuit blocks 61 to 64 into a perfectly independent state from each other in terms of signal transmission.

Next, a test signal of a predetermined level is given to the electrode pads 41 and the test electrode pads 51 so that output signals are generated thereat. It is then judged whether the output signals have a signal value as expected, whereby a discrete test of the circuit block 61 is complete. The circuit blocks 62 to 64 are tested separately in a similar manner: A test signal having a predetermined level is given to the electrode pads 42, 43 or 44 and the test electrode pads 52, 53 or 54. Output signals from the electrode pads 42, 43 or 44 and the test electrode pads 52, 53 or 54 are thereafter judged to find whether they have an expected signal value. Thus, the discrete test of the circuit blocks 62 to 64 are complete.

An overall test result of the electrical circuit part 30 is then analyzed from the test results of the discrete tests of the circuit blocks 61 to 64.

As hereinbefore disclosed, the electrical circuit part 30 is divided into the circuit blocks 61 to 64 and each circuit block is tested independently. An overall test result of the electrical circuit part 30 is then drawn from the test results of the discrete tests. Hence, a test of the semiconductor integrated circuit device of the present invention is easier than where the electrical circuit part 30 as a whole is tested.

In addition, since the circuit blocks 61 to 64 are tested independently on a small scale, the semiconductor integrated circuit device of the present invention may include a smaller number of external measurement terminals, i.e., test electrode pads, which in turn simplifies the structure of the test apparatus. Despite this improvement, the approach to enhance testability is only to appropriately divide the semiconductor integrated circuit into circuit blocks, and hence, simpler than where the adhock and the other conventional testability-considered test methods are adopted. Of further importance, the integration of the semiconductor integrated circuit device remains unaffected because there is no need to provide a test circuit part for ensuring testability within the semiconductor integrated circuit 20.

As a still further advantage, reduction in test time will be achieved if the circuit blocks 61 to 64 are tested at the same time since discrete tests of the circuit blocks 61 to 64 are possible.

Now, a multi test will be described in which a plurality of the semiconductor integrated circuit devices each having a structure as heretofore described are tested, one by one or at the same time, using corresponding test apparatuses.

Test apparatuses for separately testing the circuit blocks 61 to 64 are prepared. The test apparatus for the circuit block 61 tests a plurality of the semiconductor integrated circuit devices only regarding the circuit block 61 and does not test any other circuit blocks. Thus, the multi test is possible by testing the semiconductor integrated circuit devices in such a manner that different circuit blocks are tested at the same time. In other words, each semiconductor integrated circuit device is tested by different test apparatuses regarding different circuit blocks.

The multi test described above does not require any improvement in the test apparatuses but only uses the test apparatuses for the circuit blocks 61 to 64 mentioned above. Hence, the structures of the test apparatuses remain simple even in the multi test where a plurality of semiconductor integrated circuit device are tested.

The NMOS transistors 81 to 84 are turned on by giving a high level control signal to the control electrode pad 70 or by allowing the control electrode pad 70 to electrically float. As a result, signal transmission between the circuit blocks 61 to 64 through the internal wiring lines 80 becomes possible, which in turn permits the electrical circuit part 30 to perform regularly.

Figure 4:
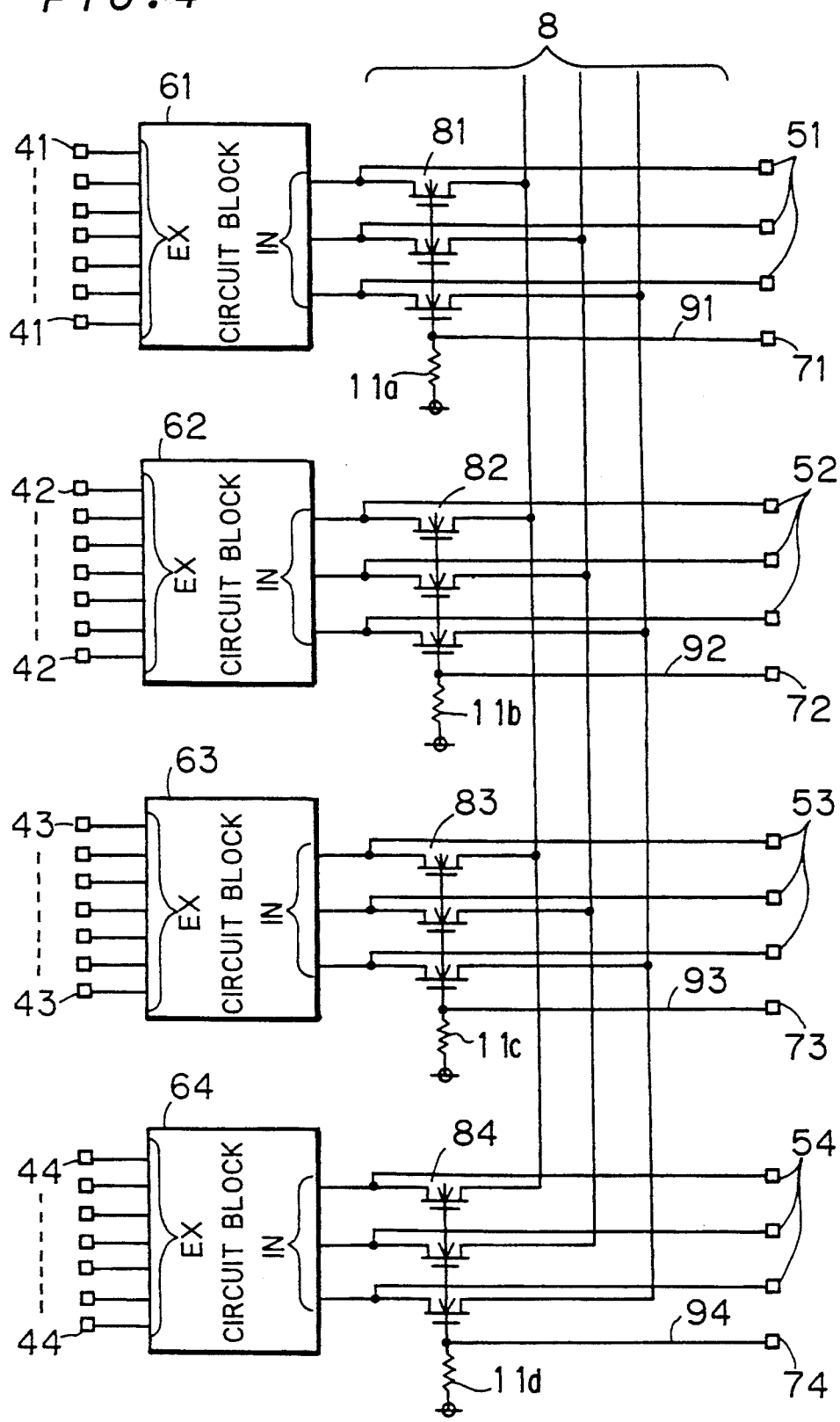
FIG. 4 is a circuitry diagram showing another electrical connection within the semiconductor integrated circuit device of FIG. 2.

FIG. 4 is a circuitry diagram showing another electrical connection between the circuit blocks. As shown in FIG. 4, the gates of the NMOS transistors 81 to 84 are connected to control electrode pads 71 to 74 through control signal lines 91 to 94, respectively. The NMOS transistors 81 to 84 are also connected to the power source $V_{cc}$ through pull down resistors 11a to 11d. The electrical connection of FIG. 4 is otherwise the same as the electrical connection of FIG. 3, and therefore, the redundant description will be omitted.

In the electrical connection as above, it is possible to selectively bring the circuit blocks into the electrically independent state by giving a high level signal selectively to the control electrode pads 71 to 74.

The reason for ensuring the electrical connection to power source $V_{cc}$ through the pull down resistor 11 as shown in FIG. 3 (or the pull down resistors 11a to 11d as shown in FIG. 4) is to turn on the normally-off type NMOS transistors even if the control electrode pad 70

(or the control electrode pads 71 to 74) is at the floating state. Hence, the electrical connection may not be necessary when other switching elements are employed in stead of the normally-off type NMOS transistors.

While the invention has been shown and described in detail, the foregoing description is in all aspects illustrative and not restrictive. It is understood that numerous modifications and variations can be devised without departing from the scope of the invention.

We claim:

1. A test method for testing a semiconductor integrated circuit device which includes n circuit blocks having internal and external signal input/output means, n being an integer greater than or equal to 2, n electrodes for transmission of an external signal, each of said n electrodes being respectively connected to said external signal input/output means of said n circuit blocks, internal wiring lines for transmission of an internal signal between said n circuit blocks, n switching means disposed in correspondence to said n circuit blocks between said internal signal input/output means of said n circuit blocks and said internal wiring lines, each of said n switching means turing on and off in accordance with a control signal supplied thereto, and n electrodes for transmission of an internal signal, each of said n electrodes being respectively connected to said internal signal input/output means of said n circuit blocks, said test method comprising the steps of:
    turning off at least one of said n switching means in accordance with said control signal; and
    supplying a predetermined test signal to one of said n electrodes for transmission of said internal signal and to one of said n electrodes for transmission of said external signal of one of said n circuit blocks which corresponds to said at least one of said n switching means, and obtaining an output signal at said one of said n electrodes for transmission of said internal signal and at said one of said n electrodes for transmission of said external signal of said one of said n circuit blocks.

2. A test method for testing a semiconductor integrated circuit device which includes n circuit blocks having internal and external signal input/output means, n being an integer greater than or equal to 2, n electrodes for transmission of an external signal, each of said n electrodes being respectively connected to said external signal input/output means of said n circuit blocks, internal wiring lines provided for transmission of an internal signal between said n circuit blocks, n switching means disposed in correspondence to said n circuit blocks between said internal signal input/output means of said n circuit blocks and said internal wiring lines, said n switching means turning on and off in accordance with a control signal supplied thereto, and n electrodes for transmission of an internal signal, each of said n electrodes being respectively connected to said internal signal input/output means of said n circuit blocks, said test method comprising the steps of:
    turning off each of said n switching means in accordance with said control signal; and
    simultaneously supplying a predetermined test signal to each of said n electrodes for transmission of said internal signal and to each of said n electrodes for transmission of said external signal corresponding to each of said n circuit blocks and obtaining an output signal at each of said n electrodes for transmission of said internal signal and at each of said n electrodes for transmission of said external signal corresponding to each of said n circuit blocks.

3. A test method for simultaneously testing a plurality of semiconductor integrated circuit devices, each of said plurality of semiconductor integrated circuit devices including n circuit blocks having internal and external signal input/output means, n being an integer greater than or equal to 2, n electrodes for transmission of an external signal, each of said n electrodes being respectively connected to said external signal input/output means of said n circuit blocks, internal wiring lines for transmission of an internal signal between said n circuit blocks, n switching means disposed in correspondence to said n circuit blocks between said internal signal input/output means of said n circuit blocks and said internal wiring lines, said n switching means turning on and off in accordance with a control signal supplied thereto, and n electrodes for transmission of an internal signal, each of said n electrodes being respectively connected to said internal signal input/output means of said n circuit blocks, said test method comprising the steps of:
    turning off, for each of said plurality of semiconductor integrated circuit devices, a selected one of said n switching means; and
    supplying a predetermined test signal to one of said n electrodes for transmission of said internal signal and to one of said n electrodes for transmission of said external signal of a selected one of said n circuit blocks which correspond to said selected one of said n switching means of each of said plurality of semiconductor integrated circuit devices, and obtaining an output signal at said one of said n electrodes for transmission of said internal signal and at said one of said n electrodes for transmission of said external signal of said selected one of said n circuit blocks, wherein all of said plurality of semiconductor integrated circuit devices do not share an identical structure.

* * * * *